(12) United States Patent
Yu et al.

(10) Patent No.: US 9,419,198 B2
(45) Date of Patent: Aug. 16, 2016

(54) NANOMESH PHONONIC STRUCTURES FOR LOW THERMAL CONDUCTIVITY AND THERMOELECTRIC ENERGY CONVERSION MATERIALS

(75) Inventors: Jen-Kan Yu, Pasadena, CA (US); Slobodan Mitrovic, Pasadena, CA (US); James R. Heath, South Pasadena, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 0 days.

(21) Appl. No.: 13/278,074

(22) Filed: Oct. 20, 2011

(65) Prior Publication Data

US 2012/0097204 A1   Apr. 26, 2012

Related U.S. Application Data

(60) Provisional application No. 61/405,787, filed on Oct. 22, 2010.

(51) Int. Cl.

| | |
|---|---|
| *H01L 35/02* | (2006.01) |
| *H01L 35/26* | (2006.01) |
| *B82Y 30/00* | (2011.01) |
| *B82Y 40/00* | (2011.01) |
| *B82Y 10/00* | (2011.01) |
| *H01L 31/18* | (2006.01) |

(52) U.S. Cl.
CPC ............... *H01L 35/26* (2013.01); *B82Y 10/00* (2013.01); *B82Y 30/00* (2013.01); *B82Y 40/00* (2013.01); *Y10T 428/24273* (2015.01); *Y10T 428/24298* (2015.01)

(58) Field of Classification Search
CPC .......... H01L 35/12; H01L 35/14; H01L 35/26
USPC ................................... 136/200, 201
See application file for complete search history.

(56) References Cited

U.S. PATENT DOCUMENTS

| | | | |
|---|---|---|---|
| 3,653,989 A | 4/1972 | Widmer | |
| 4,078,945 A | 3/1978 | Gonsiorawski | |
| 4,092,445 A | 5/1978 | Tsuzuki et al. | |

(Continued)

FOREIGN PATENT DOCUMENTS

| | | |
|---|---|---|
| JP | 2004193526 A | 7/2004 |
| WO | WO-0223607 A1 | 3/2002 |

(Continued)

OTHER PUBLICATIONS

Hochbaum et al, Enchanced thermoelectric performance of rough silicon nanowires, Jan. 2008, Nature Publishing Group, vol. 451, pp. 1-6.*

(Continued)

*Primary Examiner* — Jennifer Michener
*Assistant Examiner* — Bethany L Martin
(74) *Attorney, Agent, or Firm* — Lewis Roca Rothgerber Christie LLP

(57) ABSTRACT

A nanomesh phononic structure includes: a sheet including a first material, the sheet having a plurality of phononic-sized features spaced apart at a phononic pitch, the phononic pitch being smaller than or equal to twice a maximum phonon mean free path of the first material and the phononic size being smaller than or equal to the maximum phonon mean free path of the first material.

9 Claims, 9 Drawing Sheets

(56) References Cited

U.S. PATENT DOCUMENTS

| | | |
|---|---|---|
| 4,681,657 A | 7/1987 | Hwang et al. |
| 5,089,293 A | 2/1992 | Bohara et al. |
| 5,139,624 A | 8/1992 | Searson et al. |
| 5,206,523 A | 4/1993 | Goesele et al. |
| 5,552,328 A | 9/1996 | Orlowski et al. |
| 5,565,084 A | 10/1996 | Lee et al. |
| 5,695,557 A | 12/1997 | Yamagata et al. |
| 5,767,020 A | 6/1998 | Sakaguchi et al. |
| 5,868,947 A | 2/1999 | Sakaguchi et al. |
| 5,873,003 A | 2/1999 | Inoue et al. |
| 5,895,223 A | 4/1999 | Peng et al. |
| 5,970,361 A | 10/1999 | Kumomi et al. |
| 5,981,400 A | 11/1999 | Lo |
| 5,990,605 A | 11/1999 | Yoshikawa et al. |
| 6,017,811 A | 1/2000 | Winton et al. |
| 6,093,941 A | 7/2000 | Russell et al. |
| 6,313,015 B1 | 11/2001 | Lee et al. |
| 6,762,134 B2 | 7/2004 | Bohn et al. |
| 6,790,785 B1 | 9/2004 | Li et al. |
| 6,803,260 B2 | 10/2004 | Shin et al. |
| 6,882,051 B2 | 4/2005 | Majumdar et al. |
| 7,115,971 B2 | 10/2006 | Stumbo et al. |
| 7,135,728 B2 | 11/2006 | Duan et al. |
| 7,189,435 B2 | 3/2007 | Tuominen et al. |
| 7,190,049 B2 | 3/2007 | Tuominen et al. |
| 7,254,953 B2 | 8/2007 | Callas et al. |
| 7,291,282 B2 | 11/2007 | Tong |
| 7,309,830 B2 | 12/2007 | Zhang et al. |
| 7,465,871 B2 | 12/2008 | Chen et al. |
| 7,569,941 B2 | 8/2009 | Majumdar et al. |
| 7,572,669 B2 | 8/2009 | Tuominen et al. |
| 7,629,531 B2 | 12/2009 | Stark |
| 7,675,084 B2 | 3/2010 | Wierer, Jr. et al. |
| 7,960,258 B2 | 6/2011 | Chao et al. |
| 8,087,254 B2 | 1/2012 | Arnold |
| 8,101,449 B2 | 1/2012 | Liang et al. |
| 8,278,191 B2 | 10/2012 | Hildreth et al. |
| 8,486,843 B2 | 7/2013 | Li et al. |
| 8,641,912 B2 | 2/2014 | Heath et al. |
| 9,065,016 B2 | 6/2015 | Peter et al. |
| 9,209,375 B2 | 12/2015 | Boukai et al. |
| 9,263,662 B2 | 2/2016 | Boukai et al. |
| 2004/0152240 A1 | 8/2004 | Dangelo |
| 2005/0133254 A1 | 6/2005 | Tsakalakos |
| 2005/0176264 A1 | 8/2005 | Lai et al. |
| 2005/0215063 A1 | 9/2005 | Bergman |
| 2005/0253138 A1 | 11/2005 | Choi et al. |
| 2006/0032526 A1 | 2/2006 | Fukutani et al. |
| 2006/0118158 A1 | 6/2006 | Zhang et al. |
| 2006/0185710 A1 | 8/2006 | Yang et al. |
| 2007/0277866 A1 | 12/2007 | Sander et al. |
| 2008/0019876 A1 | 1/2008 | Chau et al. |
| 2008/0173344 A1* | 7/2008 | Zhang et al. ............ 136/238 |
| 2008/0271772 A1 | 11/2008 | Leonov et al. |
| 2008/0314429 A1 | 12/2008 | Leonov |
| 2009/0020148 A1 | 1/2009 | Boukai et al. |
| 2009/0020188 A1 | 1/2009 | Ulicny et al. |
| 2009/0117741 A1 | 5/2009 | Heath et al. |
| 2010/0035163 A1 | 2/2010 | Kobrin |
| 2010/0065810 A1 | 3/2010 | Goesele et al. |
| 2010/0126548 A1 | 5/2010 | Jang et al. |
| 2010/0147350 A1 | 6/2010 | Chou et al. |
| 2010/0193001 A1 | 8/2010 | Hirono et al. |
| 2010/0248449 A1 | 9/2010 | Hildreth et al. |
| 2011/0114145 A1 | 5/2011 | Yang et al. |
| 2011/0114146 A1 | 5/2011 | Scullin |
| 2011/0168978 A1 | 7/2011 | Kochergin |
| 2011/0215441 A1 | 9/2011 | Lin et al. |
| 2011/0263119 A1 | 10/2011 | Li et al. |
| 2011/0266521 A1 | 11/2011 | Ferrari et al. |
| 2012/0152295 A1 | 6/2012 | Matus et al. |
| 2012/0160290 A1 | 6/2012 | Chen et al. |
| 2012/0167936 A1 | 7/2012 | Park et al. |
| 2012/0217165 A1 | 8/2012 | Feng et al. |
| 2012/0282435 A1 | 11/2012 | Yang et al. |
| 2012/0295074 A1 | 11/2012 | Yi et al. |
| 2012/0319082 A1 | 12/2012 | Yi et al. |
| 2012/0326097 A1 | 12/2012 | Ren et al. |
| 2013/0019918 A1 | 1/2013 | Boukai et al. |
| 2013/0052762 A1 | 2/2013 | Li et al. |
| 2013/0087180 A1 | 4/2013 | Stark et al. |
| 2013/0175484 A1 | 7/2013 | Ren et al. |
| 2013/0186445 A1 | 7/2013 | Lorimer et al. |
| 2014/0326287 A1 | 11/2014 | Wiant et al. |
| 2014/0373888 A1 | 12/2014 | Boukai et al. |
| 2015/0101788 A1 | 4/2015 | Smith et al. |
| 2015/0162517 A1 | 6/2015 | Kasichainula |
| 2015/0228883 A1 | 8/2015 | Boukai et al. |
| 2015/0280099 A1 | 10/2015 | Boukai et al. |
| 2015/0325772 A1 | 11/2015 | Boukai et al. |

FOREIGN PATENT DOCUMENTS

| | | |
|---|---|---|
| WO | WO-2010003629 A2 | 1/2010 |
| WO | WO-2011049804 A2 | 4/2011 |
| WO | WO-2012068426 A2 | 5/2012 |
| WO | WO-2013012842 A1 | 1/2013 |
| WO | WO-2013109729 A1 | 7/2013 |
| WO | WO-2014028903 A1 | 2/2014 |
| WO | WO-2014070795 A1 | 5/2014 |
| WO | WO-2014179622 A1 | 11/2014 |
| WO | WO-2015134394 A1 | 9/2015 |

OTHER PUBLICATIONS

Lee et al, Nanoporous Si as an Efficient Thermoelectric Material, 2008, American Chemical Society, vol. 8, pp. 1-5.*

Boukai et al, Silicon nanowires as efficient thermoelectric materials, Jan. 2008, Nature Publishing Group, vol. 451, pp. 1-4.*

Bera et al, Marked Effects of Alloying on the Thermal Conductivity of Nanoporous Materials, Mar. 19, 2010, American Physical Society Physical Review Letters, 104, pp. 115502-01 to 115502-4.*

Yu et al, Reduction of Thermal Conductivity in Phononic Nanomesh Structures, Jul. 2010, Nature Nanotechnology, pp. 718-721.*

Webelement Periodic Table, Silicon the essentials.*

Yu, et al. "Reduction of thermal conductivity in phononic nanomesh structures," Nature Nanotechnology, Jul. 25, 2010, vol. 5, pp. 718-721.

Agne, et al. Doping of the nanocrystalline semiconductor zinc oxide with the donor indium, Amer Institute of Phystcs, vol. 83, No. 6, 1204, (Aug. 11, 2003).

Beckman, et al., Bridging Dimensions: Demultiplexing Ultrahigh-Density nanowire Circuits, Science 2005, 310: 465-468.

Beckman, et al. "Fabrication of Conducting. Silicon nanowire Arrays," J. Appi. Phys. 96 (10), 5921-5923'(2004).

Behnen. "Quantitative examination of the thermoelectric power of n-typesilicon in the phono drag regime".Journal of Applied Physics, vol. 67, pp. 287-292, Jan. 1, 1990.

Boukai, et al. Size-Dependent transport and thermoelectric properties of individual polycrystalline bismuth nanowires. Advanced Materials, 18, pp. 864-869, 2006.

Boukai. Thermoelectric properties of bismuth and silicon nanowires. Dissertation (Ph.D.), California Institute of Technology. 2008.

Bunimovich, et al. Quantitative Real-Time Measurements of DnA Hybridization with Alkylated nonoxidized Silicon nanowires in Electrolyte Solution, JACS 2006, 128: 16323-16331.

Chadwick, et al. Plane waves in an elastic solid conducting heat. Journal of the Mechanics and Physics of Solids 6, 223-230 (1958).

"Chen, et al. Dispenser Printed Microscale Thermoelectric Generators for Powering Wireless Sensor Networks. Paper No. IMECE2009-11636, pp. 343-352; 10 pages."

Chen, et al. Recent developments in thermoelectric materials. International Materials Reviews, vol. 48, pp. 45-66, 2003.

Choi, et al. Fabrication of bismuth nanowires with a silver nanocrystal shadowmask, J. Vac. Sci. Tech. A—Vac. Surf. and Films, 18, 1236, 1328 (2000).

Choi, et al. Fabrication of nanometer size photoresist wire patterns With a silver nanocrystal shadowmask. J. Vac. Sci. & Tech. A—Vac. Surf. and Films, 17, 1425 (1999).

(56) References Cited

OTHER PUBLICATIONS

Chung, et al. Fabrication and Alignment of Wires in Two-Dimensions. The Journal of PhysiCal Chemistry B. 102. 6685 (1998).

Collier, et al. Nanocrystal superlattices. Annu. Rev. Phys. Chem. 1998, 49: 371-404.

Deresiewicz. Plane waves in a thermoelastic solid. Journal of the Acoustical Society of America 29, 204-209 (1957).

Diehl, et al. Self-Assembly of Deterministic Carbon nanottibe Wiring networks. Angew. Chem. Int Ed. 41, 353 (2002).

European search report and opinion dated Feb. 26, 2016 for EP Application No. 13829134.9.

European search report and opinion dated Mar. 25, 2014 for EP Application No. 11835180.8.

Fan, et al. Self-Oriented Regular Arrays of Carbon nanotubes and their Field Emission Devices. Science, v. 283, p. 512 (Jan. 22, 1999).

Geballe, et al. Seebeck Effect in Silicon. Physical Review, vol. 98, pp. 940-947, May 15, 1955.

Green, et al., A 160-kilobit molecular electronic memory patterned at 1011 bits per square centimeter, nature 2007, 445: 414-417.

Gurevich. Thermoelectric properties of conductors J. Phys. (U.S.S.R.) 9, 477 (1945).

Harman, et al. Quantum dot superlattice thermoelectric materials and devices. Science, vol. 297, pp. 2229-2232, Sep. 27, 2002.

Haynes, et al. nanosphere Lithography: A Versatile nanofabrication Tool for Studies of Size-Dependent nanoparticle Optics. J. Phys. Chem. B, 105, 5599-5611 (2001).

Heath, et al. A Defect-Tolerant Computer Architecture: Opportunities for nanotechnology, Science 1998, 280: 1716-1721.

Heath, et al. Pressure/Temperature Phase Diagrams and Superlattices of Organically Functionalized Metal nanocrystal Monolayers: The Influence of Particle Size, Size Distribution, and Surface Passivant, J. Phys. Chem. B 1997, 101: 189-197.

Herring. Theory of the thermoelectric power of semiconductors. Physical Review, vol. 96, No. 5, pp. 1163-1187, 1954.

Hicks, et al.. Thermoelectric figure of merit of a one-dimensional conductor. Physical Review B 47, 1 6631-1 6634 (1993).

Hsu, et al. Cubic AgPbmSbTe2+m: Bulk thermoelectric materials with high Figure of Merit. Science, vol. 303, pp. 818-821, Feb. 6, 2004.

Huang, et al. Metal-assisted chemical etching of silicon: a review. Adv Mater. Jan. 11, 2011;23(2):285-308. doi: 10.1002/adma. 201001784.

Huang, et al. Spontaneous formation of nanoparticle strip patterns through dewetting. nature Materials vol. 4, p. 896 (2005).

Hulteen, et al. nanosphere lithography: A materials general fabrication process for periodic particle array surfaces, J. Vac. Sci. Technol. 1995, 13: 1553-1558.

Humphrey, et al. Reversible thermoelectric nanomaterials. Physical Review Letters 94, 096601 (2005).

Husain, et al. Nanowire-based very-high-frequency electromechanical resonator. Applied physics letters, vol. 83, No. 6, Aug. 11, 2003, pp. 1240-1242.

Ihab, et al. Manipulation of thermal phonons: a phononic crystal route to high-ZT thermoelectrics. Photonic and Phononic Properties of Engineered nanostructures, SPIE. 1000 20th ST. Bellingham, WA 98225-6705. Feb. 10, 2011; 7946:1-9.

International search report and written opinion dated Feb. 9, 2009 for PCT/US2008/070309.

International search report and written opinion dated Apr. 15, 2009 for PCT/US2008/064439.

International search report and written opinion dated Apr. 26, 2013 for PCT/US2013/021900.

International search report and written opinion dated Jul. 3, 2015 for PCT Application No. US2015/022312.

International search report and written opinion dated Jul. 17, 2012 for PCT Application No. PCT/US2012/047021.

International search report and written opinion dated Dec. 27, 2013 for PCT/US2013/055462.

International search report dated Feb. 10, 2014 for PCT/US2013/067346.

Joannopoulos, et al. Photonic crystals: putting a new twist on light, nature 1997, 386: 143-149.

Jung, et al. Circuit Fabrication at 17 nm Half-Pitch by nanoimprint-tithography. nanoLetters, 6, 351 (2006).

Koga, et al. Experimental proof-of-principle investigation of enhanced Z3DT in (100) oriented Si/Ge superlattices. Applied Physics Letters 77, 1490-1492 (2000).

Lee, et al. Enhanced thermoelectric figure-of-merit in nanostructured p-type silicon germanium bulk alloys. nano. Lett. 2008; 8(12):4670-4674.

Lee, et al. nanostructured bulk thermoelectric materials and their properties. ICT 2005. 24th International Conference on Thermoelectrics (ICT). 2005 284-287.

Li, et al. Measuring thermal and thermoelectric properties of one-dimensional nanostructures using a microfabricated device. Journal of heart transfer, vol. 125, pp. 881-888, Oct. 2003.

Li, et al. Thermal conductivity of individual silicon nanowires. Applied Physics Letters, vol. 83, pp. 2934-2936, Oct. 6, 2003.

Lifshitz, et al. Thermoelastic damping in micro- and nanomechanical systems. Physical Review B 61, 5600-5609 (2000).

Liu, et al. Thermal conduction in ultrahigh pure and doped single-crystal silicon layers at high temperatures. Journal of Applied Physics 98, 123523 (2005).

Llaguno, et al. Observation of thermopower oscillations in the coulomb blockade regime in a semiconducting carbon nanotube. nano Lett. 4, 45-49 (2004).

Mahan, et al. The best thermoelectric. PnAS 93, 7436-7439 (1996).

Mahan, et al. Thermoelectric materials: new approaches to an old problem. Physics Today 50, pp. 42-47, Mar. 1997.

Majumdar. Thermoelectricity in Semiconductor nanostructures. Science Feb. 6, 2004; 303(5659):777-778. DOI: 10.1126/science. 1093164.

Maranganti, et al. Length scales at which classical elasticity breaks down for various materials. Physical Review Letters 98, 195504 (2007).

Martin. nanomaterials—A membrane based synthetic approach. Science, v. 266, p. 1961-1966 (Dec. 23, 1994).

Melosh, et al. Ultra-high density nanowire lattices and circuits. Science, vol. 300, pp. 112-115, Apr. 4, 2003.

Morales, et al. A laser ablation method for the synthesis of semiconductor crystalline nanowires. Science, vol. 279, pp. 208-211, Jan. 9, 1998.

NDT Resource Center, Thermal Conductivity. Downloaded Nov. 26, 2013. https://www.nde-ed.org/EducationResources/CommunityCollege/Materials/Physical_Chemical/ThermalConductivity.htm.

Notice of allowance dated Jan. 22, 2016 for U.S. Appl. No. 14/667,177.

Notice of allowance dated Jul. 13, 2011 for U.S. Appl. No. 12/125,043.

Notice of allowance dated Jul. 29, 2015 for U.S. Appl. No. 12/175,027.

Notice of allowance dated Oct. 2, 2013 for U.S. Appl. No. 12/125,043.

Notice of allowance dated Oct. 8, 2015 for U.S. Appl. No. 14/667,177.

Notice of allowance dated Nov. 6, 2015 for U.S. Appl. No. 14/667,177.

Notice of allowance dated Dec. 10, 2015 for U.S. Appl. No. 14/667,177.

Office action dated Jan. 9, 2015 for U.S. Appl. No. 12/175,027.
Office action dated Feb. 12, 2015 for U.S. Appl. No. 13/550,424.
Office action dated Feb. 18, 2011 for U.S. Appl. No. 12/125,043.
Office action dated May 23, 2013 for U.S. Appl. No. 12/175,027.
Office action dated Jun. 22, 2011 for U.S. Appl. No. 12/175,027.
Office action dated Jun. 30, 2014 for U.S. Appl. No. 12/175,027.
Office action dated Aug. 28, 2015 for U.S. Appl. No. 13/550,424.
Office action dated Nov. 10, 2010 for U.S. Appl. No. 12/175,027.
Office action dated Nov. 17, 2015 for U.S. Appl. No. 14/372,443.
Office action dated Nov. 27, 2013 for U.S. Appl. No. 12/175,027.

Pearson. Survey of thermoelectric studies of the group-1 metals at low temperatures carried out at the national-research-laboratories, Ottawa. Soviet Physics-Solid State 3, 1024-1033 (1961).

(56) References Cited

OTHER PUBLICATIONS

Peng, et al. Ordered silicon nanowire'arrays via nanosphere lithography and metal induced etching. Applied Physics Letters, v.90, article # 163123 (2007).
Prasher. Thermal conductivity of composites of aligned nanoscale and microscale wires and pores. Journal of Applied Physics, 100, 034307, 2006, p. 1-9.
Qiu, et al. Large complete band gap in two-dimensional photonic crystals with elliptic air holes, Physical Review B 1999, 60: 10 610-10 612.
Routkevitch, et al. Electrochemical Fabrication of CdS nanowires arrays in porous anodic aluminum oxide templates. The Journal of Physical Chemistry, v. 100, p. 14037-14047 (1996).
She, et al. Fabrication of vertically aligned Si nanowires and their application in a gated field emission device. Applied Physics Letters. v; 88. article # 013112 (2006).
Sialon Ceramics. Downloaded May 6, 2013. http://www.sailon.com.au/high-temperature-seebeck-probes.htm.
Silverstein, et al. Porous polymers. John Wiley & Sons, 2011.
Small, et al. Modulation of thermoelectric power of individual carbon nanotubes. Physical Review letters, vol. 91, pp. 256801-1 to 256801-4, 2003.
Snyder, et al. Thermoelectric microdevice fabricated by a MEMS-like electrochemical process. nature Material, vol. 2, pp. 528-531, Aug. 2003.
Tang, et al. Holey silicon as an efficient thermoelectric material. nano. Lett. 2010; 10:4279-4283.
Tao, et al. Langrfluir Blodgett Silver nanowire Monolayers for Molecular Sensing Using Surface-Enhanced Raman Spectroscopy. nanoLetters 3, 1229 (2003).
Trzcinski, et al. Quenched Phonon Drag in Silicon Microcontacts. Physical Review Letters, vol. 56, No. 10, pp. 1086-1089, 1986.
Venkatasubramanian, et al. Thin-film thermoelectric devices with high room-temperature figures of merit. nature, vol. 413, pp. 597-602, Oct. 11, 2001.
Vining. Desperately seeking silicon. nature, vol. 451, pp. 132-133, Jan. 10, 2008.
Vossmeyer, et al. Light-directed assembly of nanoparticles, Angew. Chem. Int. Ed. Engl. 1997, 36: 1080-1083.
Wang, et al. A new type of lower power thermoelectric micro-generator fabricated by nanowire array thermoelectric material. Microelectronic Engineering. 2005; 77:223-229.
Wang, et al. Complementary Symmetry Silicon nanowire Logic: Power-Efficient Inverters with Gain**, Small 2006, 2: 1153-1158.
Wang, et al. Oxidation Resistant Germanium nanowires:. Bulk. Synthesis. Long Chain Alkahethioi Functionalization, and Langmuir-Blodgett Assembly. Journal of the American Chemical Society, 127, 11871 (2005).
Wang, et al., Silicon p-FETs from Ultrahigh Density nanowire Arrays, nano Letters 2006, 6: 1096-1100.
Wang, et al. Surface Chemistry and Electrical Properties of Germanium nanowires, JACS 2004, 126: 11602-11611.
Wang, et al. Use of phopshine as an n-type dopant source for vapor-liquid-solid growth of silicon nanowires. nano Letters. 2005; 5(11):2139-2143.
Weber, et al. Silicon-nanowire transistors with Intruded nickel-Silicide Contacts. nano Letters v. 6, p. 2660-2666 (2006).
Weber, et al. Transport properties of silicon. Applied Physics A: Solids and Surfaces, pp. 136-140, 1991.
Whang, et al. Large-Scale Hierarchical Organization of nanowire Arrays for Integrated nanosystems. nanoLetters 3, 1255-1259 (2003).
Williams, et al. Etch rates for micromachining processing. Journal of Microelectromechanical Systems 5, 256-269 (1996).
Wolfsteller; et al., "Comparison of the top-down and bottom-up approach to fabricate nanowire-based silicon/germanium heterostructures. Thin Solid Films 518.9 (2010): 2555-2561."
Wu, et al. Single-crystal metallic nanowires and meta semiconductor nanowires heterostructures. nature, 430. p. 61'(2004).
Xu, et al. Controlled fabrication of long quasione-dimensional superconducting nanowire arrays. nano letters, vol. 8, No. 1, Dec. 6, 2007, pp. 136-141.
Yablonovitch. Photonic band-gap structures, J. Opt. Soc. Am. B. 1993, 10: 283-297.
Yang, et al. Encoding Electronic Properties.by Synthesis of Axial Modulation Doped Silicon nanowires. Science, 310, p. 1304 (2005).
Yang, et al. Single p-Type/Intrinsic/n-TypeSilicon nanowires as nanoscale Avalanche Photodetectors, nano Letters 2006, 6: 2929-2934.
Yang, et al. Thermal conductivity of simple and tubular nanowire composites in the longitudinal direction. Physiucal Review B, 72, 125418, 2005, p. 1-7.
Yu-Ming, et al. Semimetal-semicinductor transition in bil_xSbx alloy nanowires and their thermoelectric properties. Applied Physics Letter, Volov. 81, No. 13, pp. 2403-2405, Sep. 23, 2002.
Zener, et al. Internal friction in solids III. Experimental demonstration of thermoelastic internal friction. Physical Review 53, 100-101 (1938).
Zener. Internal friction in solids I. Theory of internal friction in reeds. Physical Review 52, 230-235 (1937).
Zhong, et al. Nanowire Crossbar Arrays as Address Decoders for Integrated nanosystems, Science 2003, 302: 1377-1379.
Zhou. Determination of transport properties in chromium disilicide nanowires via combined thermoelectric and structural characterizations. nano Letters 7, 1649-1654 (2007).
Zhou, et al. Verticaly aligned Zn2SiO4 nanotube/ZnO nanowire Heterojunction Arrays. Small, v.3. p. 622-626 (2007).

* cited by examiner

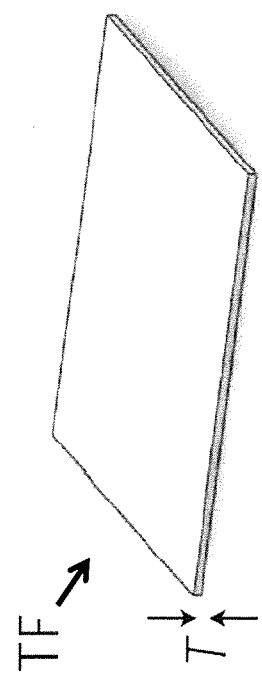
FIG. 1A
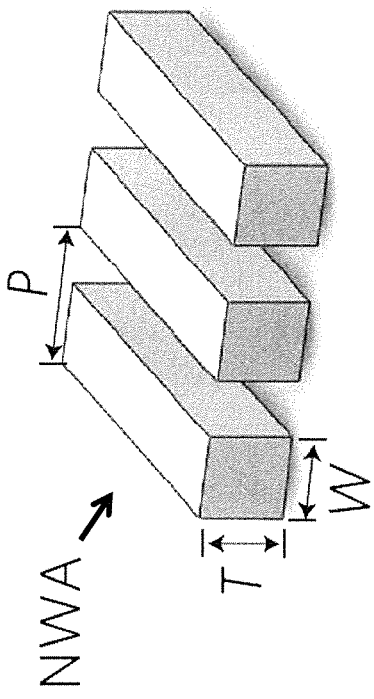
FIG. 1B
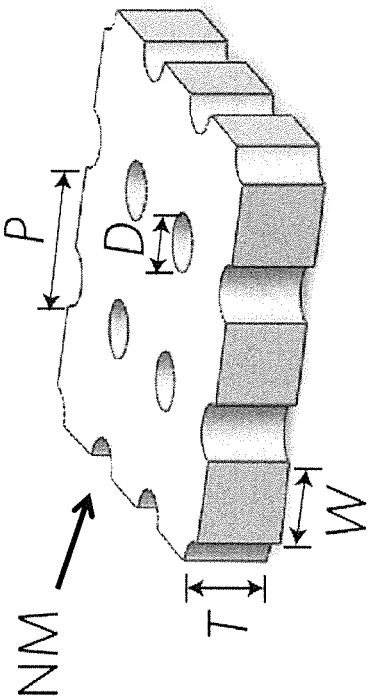
FIG. 1C
FIG. 1D

NANOMESH PHONONIC STRUCTURES FOR LOW THERMAL CONDUCTIVITY AND THERMOELECTRIC ENERGY CONVERSION MATERIALS

CROSS-REFERENCE TO RELATED APPLICATION

This non-provisional application claims the benefit of U.S. Provisional Application No. 61/405,787, filed on Oct. 22, 2010.

STATEMENT REGARDING FEDERALLY SPONSORED RESEARCH OR DEVELOPMENT

This invention was made with government support under DE-FG02-04ER46175 awarded by Department of Energy. The government has certain rights in the invention.

BACKGROUND

The thermoelectric effect refers to the conversion between temperature differences and electric voltage, which can be observed in thermoelectric materials. Thermoelectric materials are finding use in fields such as electricity generation (e.g., recovery electrical energy from waste heat), cooling (e.g., cooling integrated circuits), and heating (e.g., precision heating applications such as polymerase chain reaction machines).

Controlling the thermal conductivity of a material independently of its electrical conductivity continues to be a goal for researchers working on thermoelectric materials for use in, for example, energy applications and in the cooling of integrated circuits. In principle, the thermal conductivity ($\kappa$) and the electrical conductivity ($\sigma$) may be independently optimized in semiconducting nanostructures because different length scales are associated with phonons (which carry heat) and electric charges (which carry current). Phonons are scattered at surfaces and interfaces, so $\kappa$ generally decreases as the surface-to-volume ratio increases (e.g., as the material becomes thinner). In contrast, $\sigma$ is less sensitive to a decrease in nanostructure size, although, at sufficiently small nanostructure sizes, electrical conductivity will degrade through the scattering of charge carriers at interfaces. As such, it may be difficult to independently control the thermal conductivity $\kappa$ and the electrical conductivity $\sigma$ of a thermoelectric material.

SUMMARY

Embodiments of the present invention are directed to a structure having modified or reduced thermal conductivity compared with a bulk or a thin film equivalent and a thermoelectric material and a method of manufacturing a thermoelectric material having a thermal conductivity that can be varied substantially independently of its electrical conductivity.

According to one embodiment of the present invention, a nanomesh phononic structure includes: a sheet including a first material, the sheet having a plurality of phononic-sized features spaced apart at a phononic pitch, the phononic pitch being smaller than or equal to twice a maximum phonon mean free path of the first material and the phononic size being smaller than or equal to the maximum phonon mean free path of the first material.

The phononic pitch may be smaller than twice a dominant phonon mean free path of the first material and the phononic size may be smaller than or equal to the dominant phonon mean free path of the material.

The phononic-sized features may be holes or voids. The phononic-sized features may be filled with a second material different from the semiconductor. The second material may include a material having lower thermal conductivity than the first material or a high acoustic mismatch with the first material.

The first material may include a semiconductor material. The semiconductor material may include silicon. The phononic size may be in the range from 5 nm to 100 nm. Each of the phononic sized features may be approximately 15 nanometers across. The phononic pitch may be in the range of 10 to 200 nanometers. The phononic sized features may be spaced at a pitch of approximately 30 nanometers.

The phononic-sized features may be round or rectangular.

According to another embodiment of the present invention, a thermoelectric device includes: a sheet including a semiconductor material, the sheet having a plurality of phononic-sized features spaced apart at a phononic pitch, the phononic pitch being smaller than or equal to twice a maximum phonon mean free path of the semiconductor material and the phonic size being smaller than or equal to the maximum phonon mean free path of the semiconductor material, the sheet including an n-doped region and a p-doped region; a first electrode electrically coupled to a first side of the sheet; and a second electrode electrically coupled to a second side of the sheet.

According to one embodiment of the present invention, a method of manufacturing a nanomesh phononic structure includes: pre-doping a silicon-on-insulator (SOI) wafer; transferring a device defining pattern from a mask onto a silicon epilayer of the SOI wafer by etching; patterning the SOI wafer using to form a plurality of phononic-sized features spaced apart at a phononic pitch.

The pre-doping the SOI wafer may include applying a spin-on dopant. The pre-doping the SOI wafer may include ion implantation.

The etching may be reactive ion etching. The reactive ion etching may be $CF_4$/He reactive ion etching.

The transferring the device defining pattern from the mask onto the silicon epilayer of the SOI wafer by etching may include forming a mask using a self-assembling block copolymer and etching using a chemical etch.

The pattering the SOI wafer may include using a superlattice nanowire pattern transfer technique.

The pattering the SOI wafer may include using electron beam lithography.

BRIEF DESCRIPTION OF THE DRAWINGS

The accompanying drawings, together with the specification, illustrate exemplary embodiments of the present invention, and, together with the description, serve to explain the principles of the present invention.

FIG. 1A is a schematic perspective view of a thin film device having a thickness T.

FIG. 1B is a schematic perspective view of a nanowire array having a thickness T, a wire width W, and a wire pitch P.

FIG. 1C is a schematic perspective view of a large feature size mesh formed by electron beam lithography and having a thickness T, the mesh ribbons of the mesh having a ribbon width W and ribbon pitch P and leaving openings having length D on a side.

FIG. 1D is a schematic perspective view of a nanomesh structure according to one embodiment of the present invention, the nanomesh structure having a thickness T, a plurality of holes spaced at pitch P and having diameters D, and a plurality of nanomesh channels between the holes, the nanomesh channels having a channel width W.

DETAILED DESCRIPTION

Figure 2A:
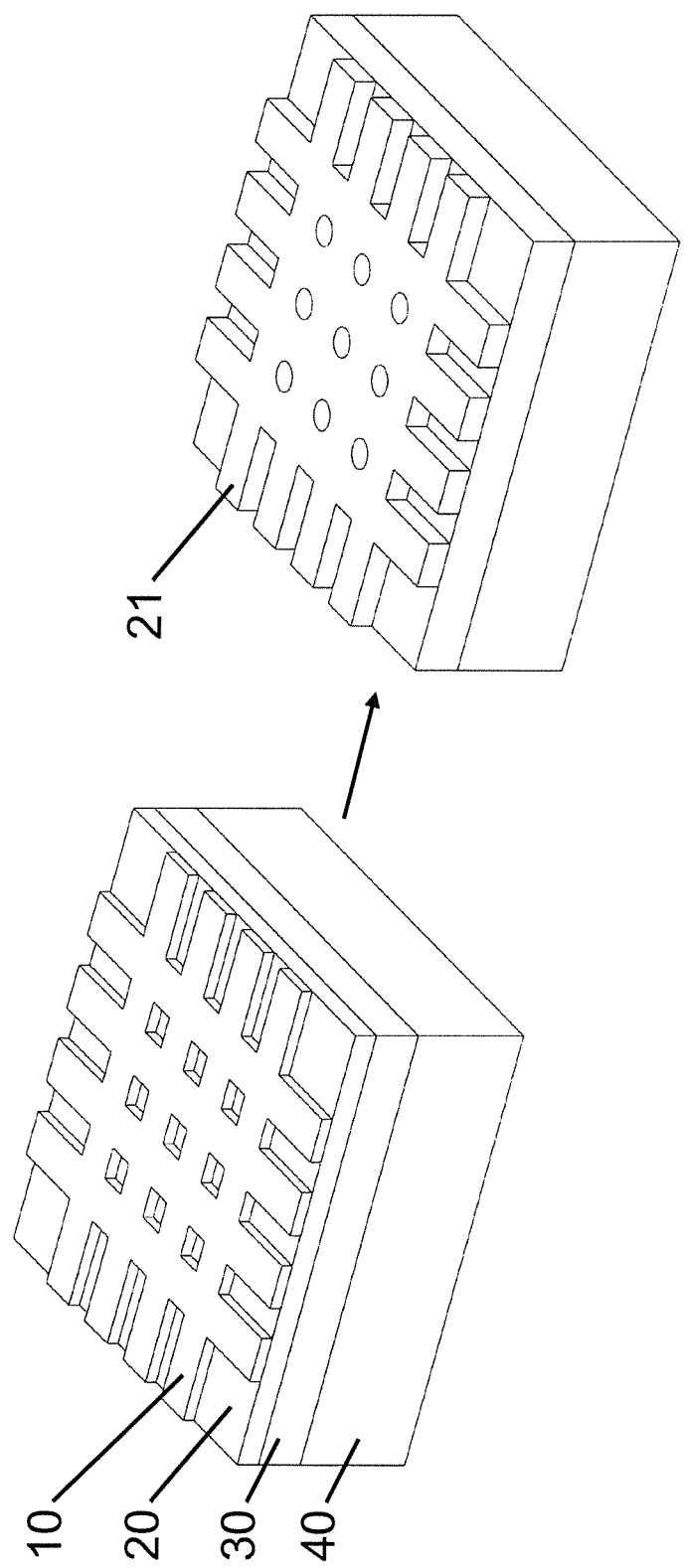
FIG. 2A is a schematic perspective view of a method of fabricating a nanomesh film using a superlattice nanowire pattern transfer (SNAP) technique, according to one embodiment of the present invention.

In the following detailed description, only certain exemplary embodiments of the present invention are shown and described, by way of illustration. As those skilled in the art would recognize, the invention may be embodied in many different forms and should not be construed as being limited to the embodiments set forth herein. Like reference numerals designate like elements throughout the specification.

In certain applications such as thermoelectric devices, a material having low thermal conductivity $\kappa$ and high electrical conductivity $\sigma$ may be desired for increased device performance. This relationship is typically expressed as a figure of merit (ZT) for thermoelectric devices, typically defined by $$ZT = \frac{\sigma S^2 T}{\kappa},$$

where S is the Seebeck coefficient of the material of the device and T is the temperature of the device. Generally, a thermoelectric device includes a thermoelectric material having an n-doped region and a p-doped region and first and second electrode coupled to first and second portions of the thermoelectric material. When a temperature difference is applied between the first and second electrodes, an electrical potential (a voltage) is generated between the first and second electrodes. Conversely, when an electrical potential is applied between the first and second electrodes, a temperature difference is generated between the first and second electrodes. Such thermoelectric devices typically include thermoelectric materials such as bismuth telluride ($Bi_2Te_3$) and bismuth selenide ($Bi_2Se_3$). However, these materials may be too expensive for large scale production. Therefore it would be desirable if a thermoelectric material could be produced using a more cost effective starting material.

Thermal conductivities $\kappa$ in nanoscale systems are often compared to the minimum thermal conductivity of the bulk amorphous material $\kappa_{min}$, and the characteristic length scales are often compared to the dominant values of the phonon mean free path $\Lambda$ (the distance the phonons can travel inside the material unimpeded) and the phonon wavelengths $\lambda$. For bulk silicon at room temperature, $\kappa_{min} \approx 1$ W m$^{-1}$ K$^{-1}$, $\Lambda \approx 300$ nm and $\lambda \approx 1$-2 nm. Increased boundary scattering leads to reductions in thermal conductivity $\kappa$ when the characteristic length scales are comparable to or smaller than the maximum phonon mean free path $\Lambda$ of the material, as is the case for thin films, superlattices and nanowires. These length scales will be referred to herein as "phononic" lengths, and "comparable" lengths may be up to twice the length of the maximum phonon mean free path $\Lambda$.

When bulk materials are reduced to thin films, nanowires or nanoparticles, thermal conductivity is lowered from the bulk value. The reduction of thermal conductivity $\kappa$ follows the reduction of size, which is described by a critical dimension (approximately the film thickness for thin films, the diameter of the cross-section for nanowires, and the diameter for nanoparticles). Thermal conductivity $\kappa$ is reduced if phonons, the quasiparticles that carry heat, are scattered (e.g., if a scattering mechanism is shortening the mean-free path of the phonons). Heat carrying phonons have a distribution of mean-free path lengths (see, e.g., Dames, Chen, Thermoelectrics Handbook; from Macro to Nano, Chapter 22). When the critical dimension of the nanostructure is less than the maximum mean-free path in the distribution, phonons start to be filtered out of the conduction, resulting in a reduced overall lower thermal conductivity.

For 10-20 nm diameter silicon nanowires, or for larger nanowires with roughened surfaces, thermal conductivity $\kappa$ is reduced by as much as two orders of magnitude relative to bulk crystalline silicon and approaches the theoretical minimum thermal conductivity $\kappa_{min}$. The size-dependent reduction in $\kappa$ occurs through modification of the scattering relaxation rates (although the phonon band structure remains bulk-like). There have been proposals to use coherent phonon processes to modify the phonon band structure. For example, the use of periodic superlattice structures can influence the phonon group velocity.

However, scattering at the superlattice interfaces can partially or wholly mask such effects, meaning that incoherent scattering also dominates the thermal properties of these systems. In addition, 10-20 nm diameter silicon nanowires may exhibit significantly reduced electrical conductivity $\sigma$ compared with bulk materials. In particular, electrical conductivity decreases rapidly at dimensions below 20 nm.

Aspects of embodiments of the present invention relate to a thermoelectric material in which the thermal conductivity $\kappa$ can be independently controlled by altering the phonon band structure of a semiconductor thin film through the formation of a phononic nanomesh film. In nanomeshes, the above described mechanism of reducing thermal conductivity $\kappa$ by forming a film having a thickness thinner than the maximum phononic length of the bulk material only accounts for one part of the thermal conductivity reduction. These nanomesh films are also patterned with nanoscale features (e.g., holes) at periodic spacings that are comparable to (e.g., no more than twice), or shorter than, the maximum phonon mean free path Λ of the material. These distances may be referred to as "phononic" lengths. These nanoscale features at phononic spacings influence the thermal conductivity κ through wave effects (interference), which will be referred to as "phononic" effects. As such, the phononic scale features can further reduce the thermal conductivity κ of the structure beyond the reductions achievable by nanostructuring (e.g., thin structures) alone.

In one embodiment of the present invention, a phononic nanomesh structure may include a grid of nanoscale features (e.g., holes, voids, and inclusions of other materials) spaced at phononic lengths. For example, a silicon phononic nanomesh structure may be a sheet (or a thin film) of material that includes a plurality of holes 20 nm spaced at a pitch of 34 nm, both of these lengths being smaller than the 1 μm the maximum phonon mean free path Λ for bulk silicon at room temperature (and also below the 300 nm dominant phononic length). The shape of the nanoscale features may be, but is not limited to, round, rectangular, or rectangular with rounded corners. The grid may be, but is not limited to, a square grid, a rectangular grid, or a hexagonal grid. The nanomesh structure exhibits a substantially lower thermal conductivity than a similarly prepared array of silicon nanowires, even though the nanowire array has a significantly higher surface-to-volume ratio.

One embodiment of the present invention includes a nanomesh structure formed of silicon. The distribution of phonon mean free paths Λ in bulk silicon is up to approximately 1 μm, with dominant mean free path (e.g., most of the phonons) around 300 nm. As such, nanomeshes with pitches under 1 micron will lower thermal conductivity. In nanomeshes under 1 micron in thickness, the length of the mean free path distribution has an upper limit corresponding to the thickness and separation of holes. In other words, the thickness of the nanomesh and the separation of the holes determine a new maximum mean free path Λ of the nanomesh. Since most of the phonons in bulk have a mean free path Λ around 300 nm, a significant reduction in thermal conductivity occurs at sizes comparable or smaller to that dominant mean free path value. The phononic effects generally arise when the holes are at pitches that are not much larger (e.g., <2 times) than the mean free path of the structure (that is, the new mean free path that is limited by the separation of holes and by thickness of the film). For example, a 100 nm thin nanomesh structure would have holes smaller than or equal to about 100 nm spaced at a pitch less than or equal to 200 nm in order to observe significant phonic effects due to the presence of the holes. A nanomesh having a thickness of around 20 nm would have a further reduced thermal conductivity κ and, in one embodiment, would have holes at about 20 nm in diameter, and may be separated at a pitch of, for example, 34 nm. Such a structure would have a lower thermal conductivity overall than the 100 nm thin nanomesh having 100 nm holes at a pitch of 200 nm.

In other embodiments of the present invention, in which the nanomesh is formed of other materials, the distribution of the mean free path Λ will be different, but the nanomesh could be designed using similar reasoning in which the sizes of the features and the spacing between the features would be selected based on the maximum mean free path of the material due to the characteristic bulk mean free path and/or the thickness of the material.

In addition, the nanomesh structure exhibits bulk-like (e.g., relatively high) electrical conductivity, whereas nanowire arrays exhibit significant decreases in electrical conductivity at small scales (e.g., when the wire diameter is below about 20 nm). The high electrical conductivity of the nanomesh structure compared to the electrical conductivity of the nanowire arrays may be due to the fact that even a single local defect (such as a region having a low dopant concentration) in a nanowire of the nanowire array would significantly increase the resistance of that entire nanowire, whereas a local defect in the nanomesh structure would have only a minor effect on the resistance of the structure because electrical current can flow around the defect through electrically parallel paths in adjacent portions of the nanomesh structure.

Therefore, the thermal conductivity κ and the electrical conductivity σ can be substantially independently controlled by modifying the size and spacing of the nanoscale features, thereby allowing a thermoelectric material to be designed for particular application requirements using a commonly available material such as silicon rather than more exotic materials such as bismuth telluride ($Bi_2Te_3$) and bismuth selenide ($Bi_2Se_3$).

Aspects of embodiments of the present invention are also directed to reducing the thermal conductivity of a material by patterning the material with phononic sized features (e.g., holes, voids, and inclusions of other materials) spaced at phononic lengths.

According to some embodiments of the present invention, periodic, single-crystal nanomesh structures, patterned on a scale at which phonon band-structure modifications can be observed can be used as materials having low thermal conductivity (low-κ materials). Reductions in thermal conductivity κ can be attributed to the nanomesh superstructure, rather than to classical size effects.

The performance of a nanomesh structure NM as illustrated, for example, in FIG. 1D can be compared with the performance of three reference structures: a silicon thin film device TF as shown in FIG. 1A, an array of silicon nanowires NWA with rectangular cross-sections as shown in FIG. 1B, and a larger feature-size mesh EBM that is formed by electron-beam lithography as shown in FIG. 1C.

FIGS. 1A, 1B, 1C, and 1D and Table 1 summarize the relevant dimensions (including surface/volume ratio), which were chosen to permit direct comparison of the structures. Experiments were performed on two similar nanomesh devices (NM1 and NM2, see FIGS. 1D, 2A, and 2B) with the same periodicity and thin film thickness, and a small difference in the size of the holes (as described in Table 1). The thickness was nearly identical for all devices, and the nanowire cross-sectional areas were similar to the grid lines within the nanomesh films.

TABLE 1

|  | T (nm) | W (nm) | D (nm) | P (nm) | Surface/Volume ($nm^{-1}$) |
| --- | --- | --- | --- | --- | --- |
| TF | 25 | — | — | — | 0.08 |
| EBM | 22 | 115 | 270 | 385 | 0.07 |
| NWA | 20 | 28 | — | — | 0.17 |
| NM 1 | 22 | 23 | 11 | 34 | 0.12 |
| NM 2 | 22 | 18 | 16 | 34 | 0.14 |

To measure the characteristics of the devices, the devices were fully suspended (FIG. 2C) between two free-standing membranes (FIG. 2D) that acted as the hot and cold ends for heat transport measurements. Temperature-dependent values of κ were determined by measuring the amount of heat generated by the resistive heater on one of the membranes and the temperature difference between the hot and cold sides.

According to one embodiment of the present invention, fully suspended silicon nanomesh films (FIGS. 2A and 2B) are fabricated starting with a ⟨100⟩ silicon-on-insulator (SOI) thin film. Electronic properties were selected by boron diffusion doping of the initial thin film. As shown in the embodiment of FIG. 2A, the pattern of two intersecting platinum nanowire arrays 10 is transferred onto a silicon epilayer 20 on a buried silicon dioxide layer 30 and a silicon handle layer 40. In one embodiment, the intersecting platinum nanowire arrays 10 are created using the superlattice nanowire pattern transfer (SNAP) technique, which translates the layer spacings within a GaAs/Al$_x$Ga$_{(1-x)}$As superlattice into the width and pitch of a nanowire array. Two successive SNAP processes would be used to create an intersecting array. After patterning the silicon epilayer 20, the platinum nanowire arrays 10 are removed, leaving a silicon nanomesh structure 21.

According to one embodiment of the present invention, the devices are prepared on SOI wafers (Soitec), which are pre-doped by thermally diffusing a spin-on dopant (Boron A; Filmtronics) using rapid thermal annealing at 820° C. for 3 min. In one experiment, the wafer sheet resistance indicated a doping concentration of $2 \times 10^{19}$ cm$^{-3}$. The TF, EBM, NWA, NM 1, and NM 2 devices were fabricated by transferring a device defining pattern from a platinum mask into the silicon epilayer by CF$_4$/He reactive ion etching. The TF and EBM devices were patterned by electron-beam lithography, and the NWA and NM devices were patterned by the superlattice nanowire pattern transfer (SNAP) technique (FIG. 2A). The thicknesses of the devices were determined by measuring the silicon epilayer thickness with an atomic force microscope. The other size parameters listed in Table 1 were determined from scanning electron microscope (SEM) images.

The nanomesh structure can also be fabricated by patterning the nanomeshes in thin films or wafers and the patterns may be transferred by etching or may be grown. Patterning techniques include lithography (e.g., electron beam lithography, interference lithography, etc.) and etching techniques include dry etching (e.g., plasma based etching) or wet etching (e.g., electroless etching).

Figure 2B:
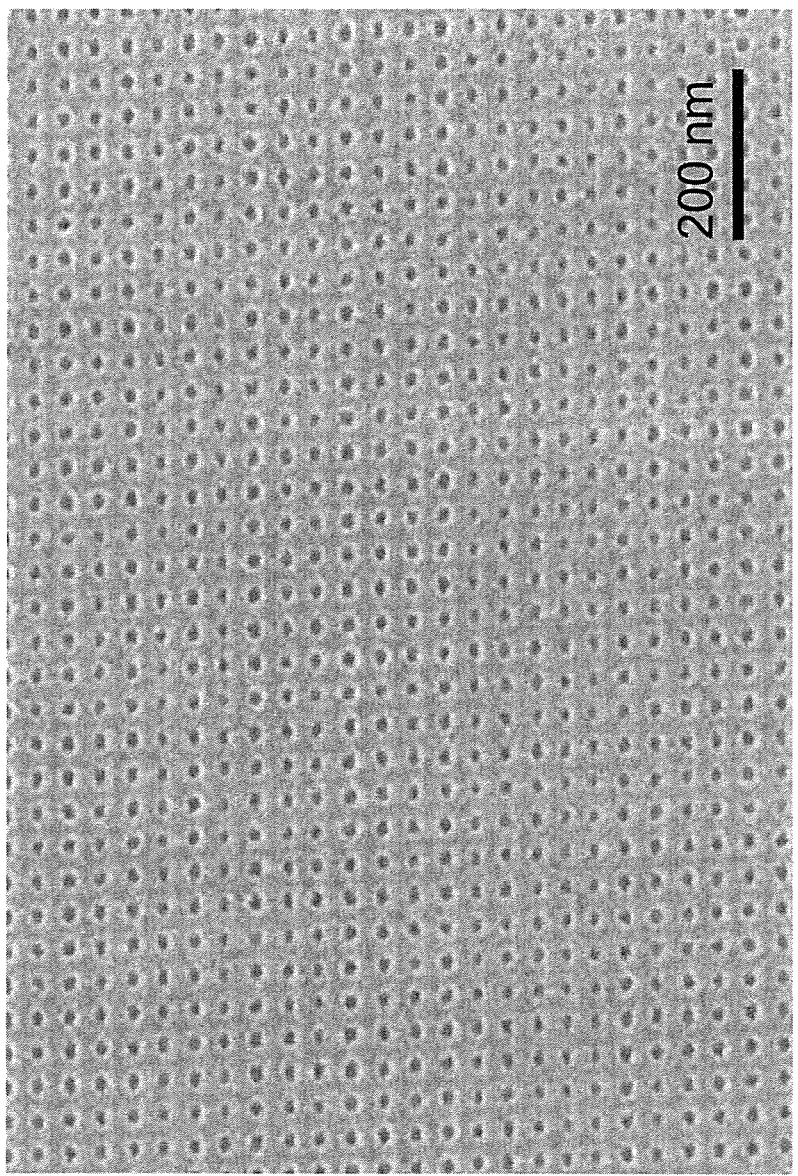
FIG. 2B is a scanning electron microscope (SEM) image of a portion of a silicon nanomesh film, showing a substantially uniform square-lattice matrix of cylindrical holes according to one embodiment of the present invention.
Figure 2C:
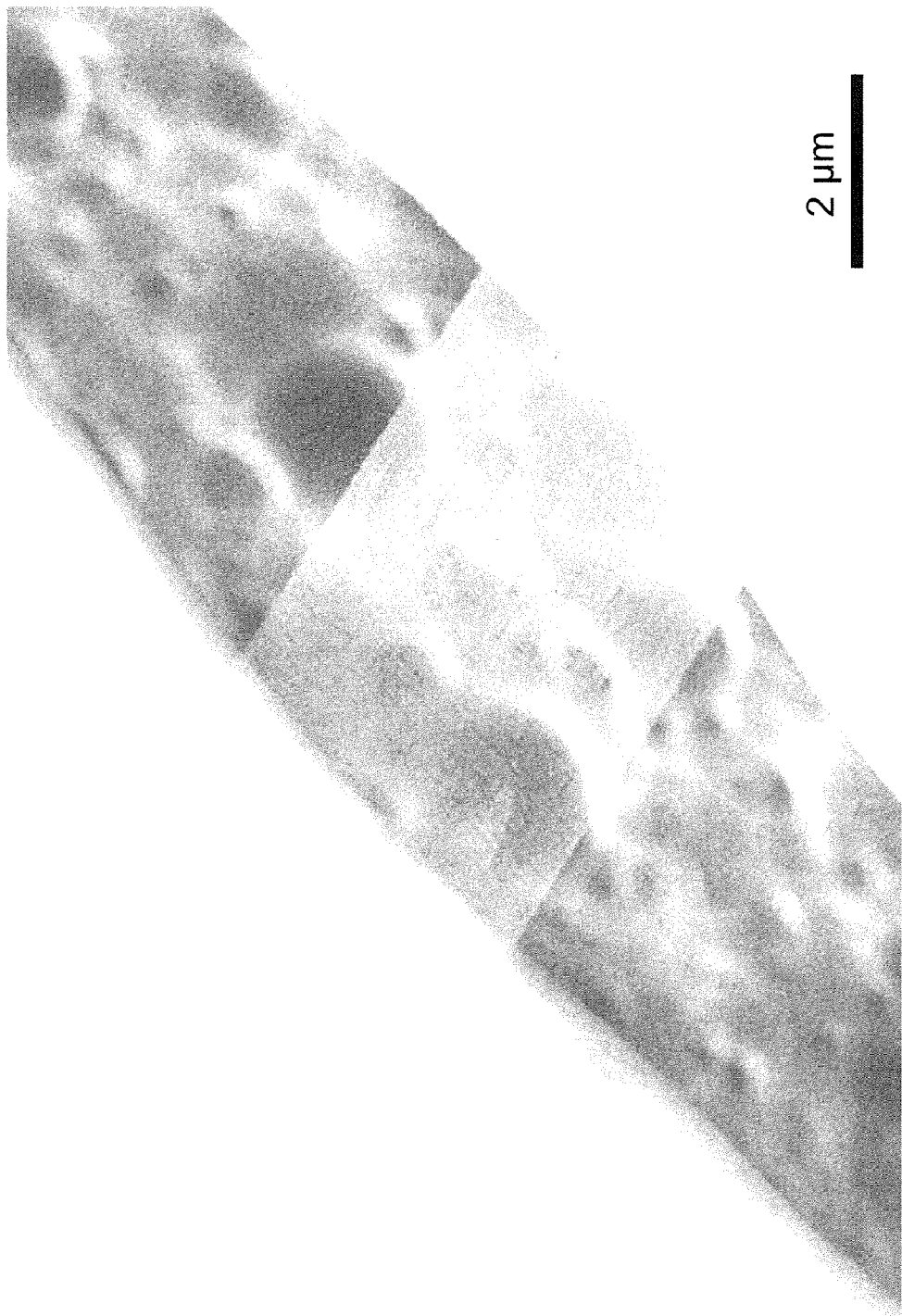
FIG. 2C is an SEM image of a released, transparent nanomesh film according to one embodiment of the present invention, suspended between two membranes.
Figure 2D:
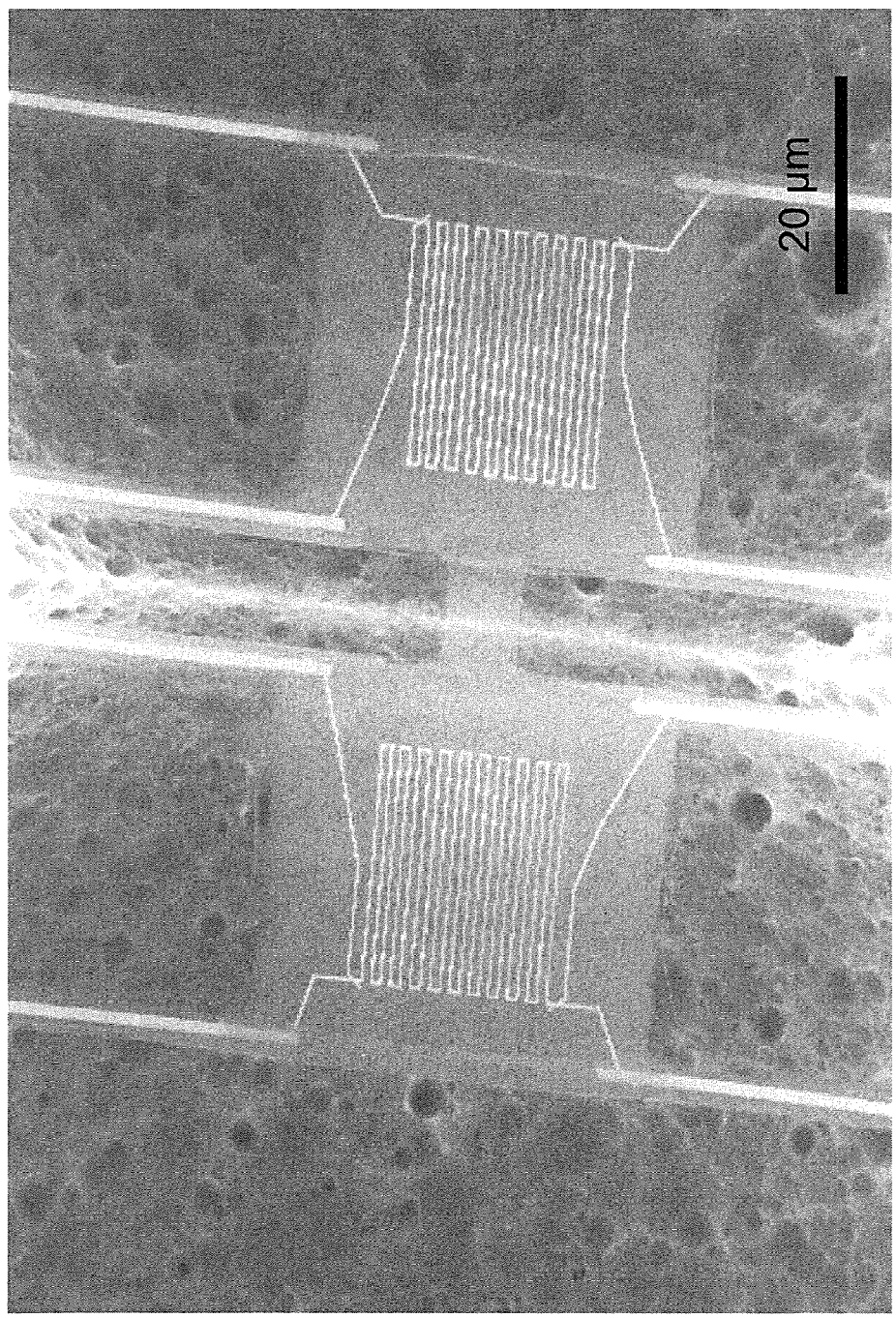
FIG. 2D is an SEM image of a nanomesh film according to one embodiment of the present invention, suspended between two suspended membranes with heaters/sensors, together with suspended beams carrying leads for thermal conductivity measurements.
Figure 2F:
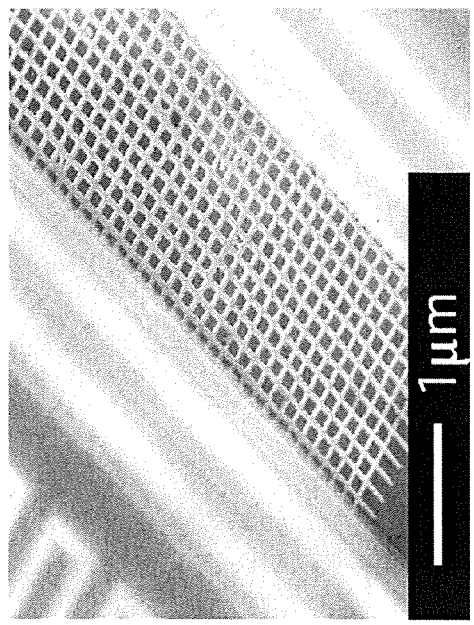
FIG. 2F is an SEM image of a suspended electron beam mesh (EBM) device.
Figure 2E:
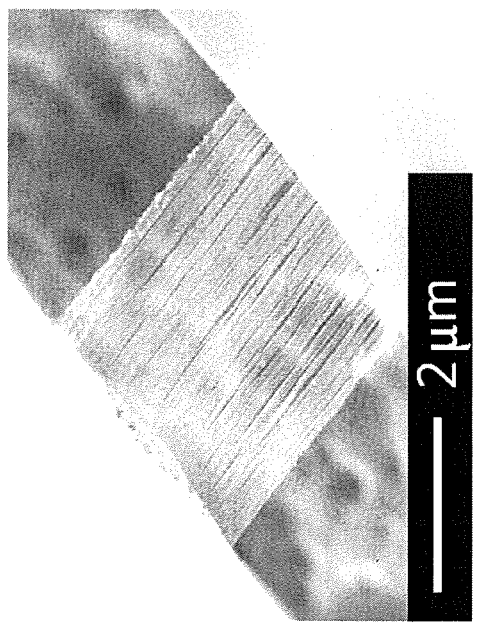
FIG. 2E is an SEM image of a suspended nanowire array (NWA) device.

FIG. 2B is a scanning electron microscope (SEM) image of a portion of a silicon nanomesh film, showing a substantially uniform square-lattice matrix of cylindrical holes according to one embodiment of the present invention. FIG. 2C is an SEM image of a released, transparent nanomesh film according to one embodiment of the present invention, suspended between two membranes. FIG. 2D is an SEM image of a nanomesh film according to one embodiment of the present invention, suspended between two suspended membranes with heaters/sensors, together with suspended beams carrying leads for thermal conductivity measurements. FIG. 2E is an SEM image of a suspended NWA device. FIG. 2F is an SEM image of a suspended EBM device.

Figure 3:
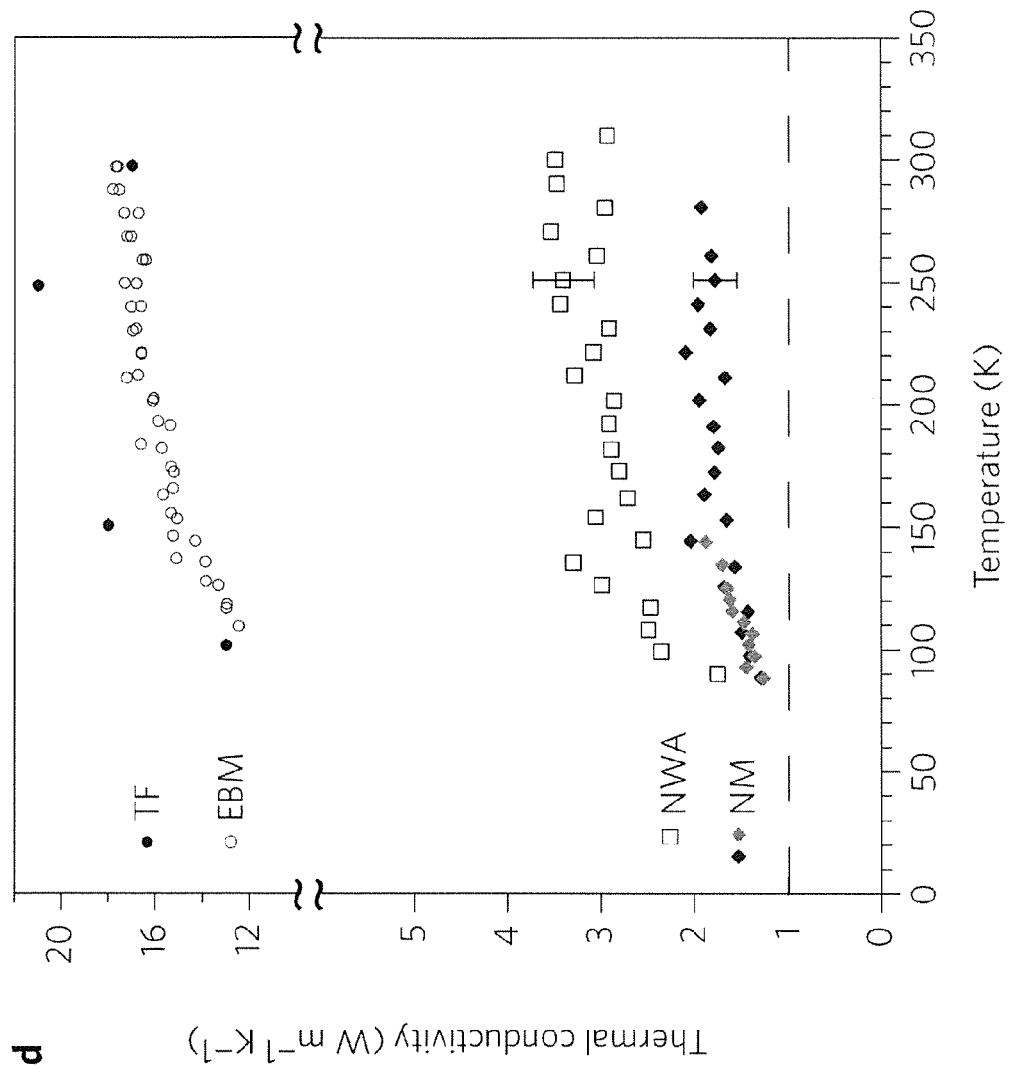
FIG. 3 is a graph showing experimentally measured values of thermal conductivity with respect to temperature of the thin film device, nanowire array device, electron beam mesh device, and nanomesh structure devices according to embodiments of the present invention.

FIG. 3 is a graph comparing the experimentally determined thermal conductivity κ values for the two nanomesh devices (NM 1 and NM 2) according to embodiments of the present invention with the measured thermal conductivities of reference structures. For the TF device, $\kappa \approx 17$ W m$^{-1}$K$^{-1}$ at room temperature. The decrease in κ from the value for bulk silicon ($\kappa = 148$ W m$^{-1}$ K$^{-1}$) is consistent with published results, and arises due to the thickness (25 nm) of the film being smaller than the maximum phonon mean free path Λ of silicon (about 1 μm). The reduced cross-section of the nanowires comprising the NWA device leads to a further reduction of thermal conductivity to $\kappa = 3.5$ W m$^{-1}$ K$^{-1}$ at room temperature, a result that is again consistent with published results.

Figure 4:
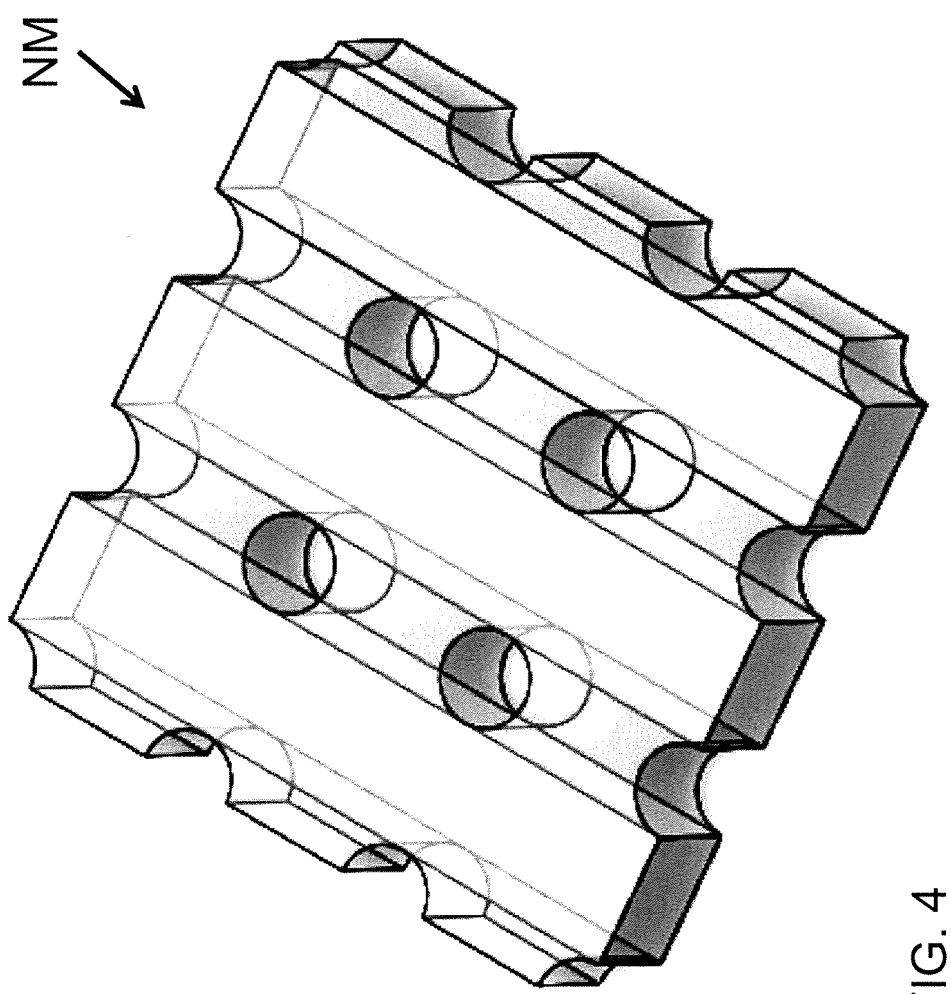
FIG. 4 is a schematic perspective view of a nanomesh structure according to one embodiment of the present invention illustrating a simplification in which an upper bound of the thermal conductivity of the nanomesh structure is approximated by considering the thermal conductivity of a plurality of parallel thermal channels.

To calculate κ for the nanomesh and EBM films, an approximation was applied, with the mesh structure being treated as two intersecting arrays of rectangular channels as illustrated in FIG. 4, where one array of parallel channels along the direction of the heat gradient is highlighted. In nanomesh devices, these channels resemble the nanowires in the NWA device; in the EBM device they are wide ribbons. Heat transport is essentially diffusive, and the phonon wavelength λ is generally an order of magnitude smaller than any of the dimensions in either the EBM or the nanomesh films NM 1 and NM 2. As a result, only the channels running along the temperature gradient contribute significantly to the thermal conductance through the device, and the perpendicular channels are effectively isothermal. In the EBM device, there is only a small increase in boundary scattering compared to the TF device, because Λ is predominantly defined by the similar thickness of both devices. Accordingly, the thermal conductivity values of κ for the EBM and TF devices are comparable.

The equivalent channel approximation is probably less accurate for the nanomesh due to the round shape of the holes and the fact that the grid line width is comparable to the pitch. However, the thermal conductivity κ of the nanomesh will only be overestimated by this approximation, so the room temperature measurement of 1.9 W m$^{-1}$ K$^{-1}$ merely represents the upper limit for the actual κ. A reduction of at most 20% for the nanomesh films relative to the nanowires in the NWA device would be expected if we consider only the small difference in size between the equivalent channels and the nanowires. Similarly, a significant increase in κ would be expected for the nanomesh films relative to the NWA if we considered only the relative surface-to-volume ratios. The measured κ for the nanomesh films is, however, a factor of 2 smaller than that of the NWA device. In addition, FIG. 3 shows that the measured thermal conductivity κ of the nanomesh is approximately a factor of 10 smaller than that of the bulk thin film TF and the electron beam mesh EBM.

Matthiessen's rule, $\tau^{-1} = \tau_{imp}^{-1} + \tau_U^{-1} + \tau_B^{-1}$, captures the dominant phonon-scattering mechanisms. Here, τ represents the total phonon relaxation time, and the subscripts imp, U and B refer to impurity scattering, Umklapp processes and boundary scattering, respectively. $\tau_U$ or $\tau_{imp}$ would be unlikely to vary between similarly doped devices (FIG. 3). Surface roughness can exert an influence on $\tau_B$. However, the roughness of the nanomesh films is less than or equal to the roughness of the NWA device, where fabrication processes can introduce roughness only to the walls of the holes of the nanomesh film, rather than along the entire length of the nanowire side surfaces. In addition, the surface-to-volume ratio of the nanomesh is significantly smaller than that of the nanowires (see Table 1, above). The reduction in thermal conductivity κ for the nanomesh relative to the NWA device is a consequence of the nanomesh superstructure and the related modification of the bulk phonon dispersions.

The observed drop in thermal conductivity κ may be caused by a coherent effect in which holes play the role of Bragg reflectors, similar to the coherent phonon processes that are invoked in certain superlattice thin films. The periodicity of the superstructure—either the one introduced by the holes in the nanomeshes or by the alternating thin film layers in superlattices—modifies the phonon band structure by reducing the Brillouin zone. In superlattice structures, scattering of thermal phonons at the successive interfaces between the composite layers can dominate over such coherent mechanisms. However, the superstructure of the nanomesh is imposed within a single-crystalline piece of material where coherence may be readily maintained. In addition, the period of the superstructure is of the order of the mean free path of the thermal phonons (Λ>25 nm), enabling the observation of wave-like effects that can emerge from the Brillouin-zone reduction. As a result, the phonon bands are folded 62 times (superstructure period/silicon lattice parameter) and considerably flattened when compared to bulk silicon bands.

Brillouin-zone reduction effects have been studied theoretically in superlattices, where the treatment is equivalent for the case of cross-plane transport, and all contributions to κ are considered to be spectral quantities:

$$\kappa(T) \propto \int_\lambda C_{v,\lambda}(T) v_\lambda^2 \tau_\lambda(T) d\lambda.$$

Adopting these results, no corrections are expected at 300 K in the specific heat $C_{v,\lambda}$. The relaxation times $\tau_\lambda$ may change in periodic structures, but only for small periods and at low temperatures. Therefore, the most significant contribution to a reduction in κ is expected to come from the decrease in the phonon group velocity $v_\lambda$ as a direct consequence of the flattening of phonon bands. A complete phonon band-structure modeling will be necessary to estimate the extent of the reduction of κ in this system, but in the case of superlattices, factors of 2 to 10 have been found, which is consistent with the nanomesh results. Theoretical modeling of silicon three-dimensional phononic crystals indicates that the phonon band flattening, as observed in the nanomesh structures, may lead to thermal conductivities below $\kappa_{min}$. Highly voided materials, such as nanoporous silicon, have been shown by molecular dynamics modeling to exhibit low κ, but the results published to date have largely focused only on boundary scattering mechanisms. Theoretical simulations of very thin (diameter, 2-3 nm) silicon nanowires have indicated that an amorphous surface layer can yield a temperature-independent and low value of κ. However, the nanomesh structures NM 1 and NM 2 are not in this regime, and the surface-to-volume ratio effects on κ that would be expected from this mechanism were not observed.

Figure 5:
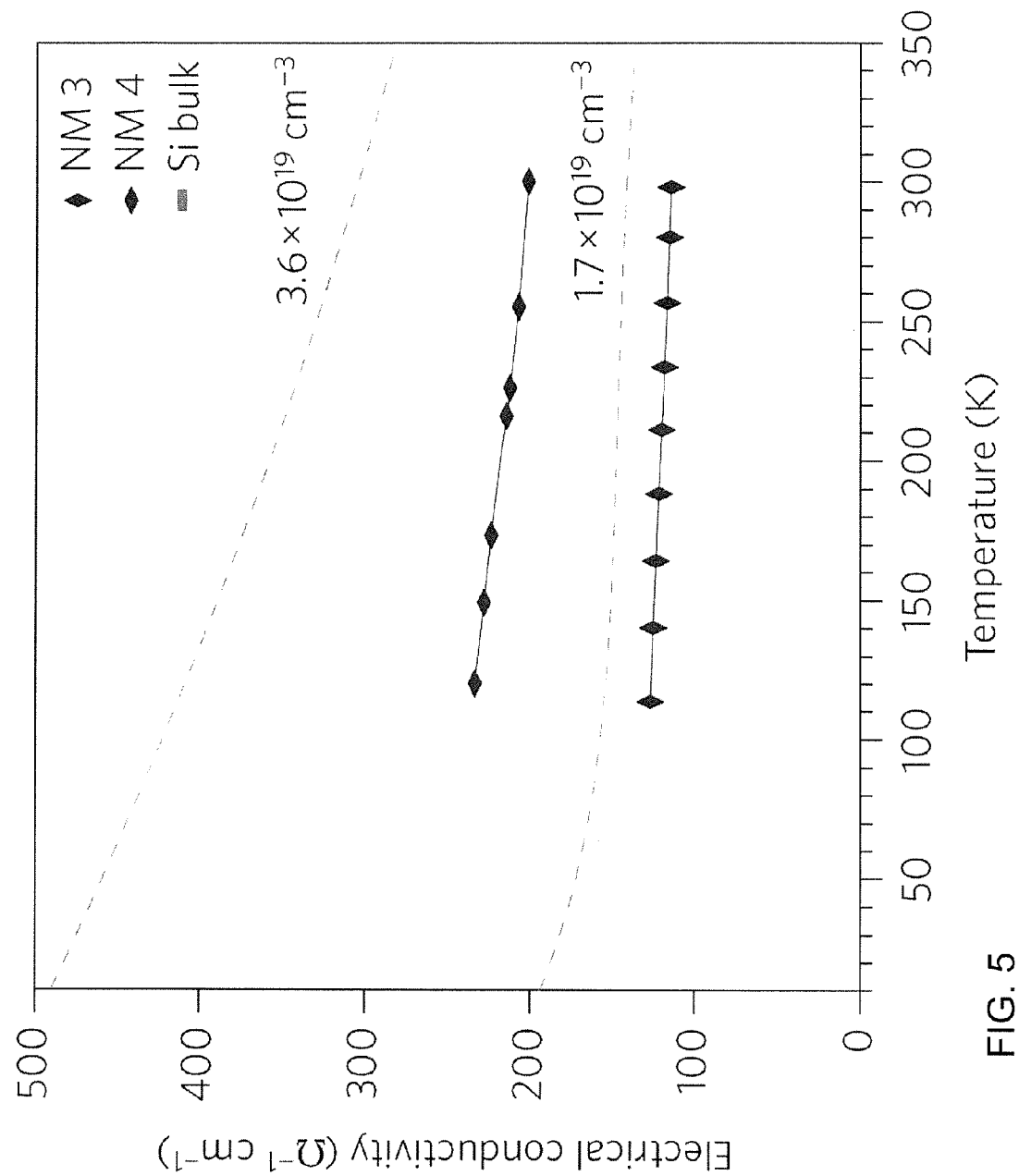
FIG. 5 is a graph comparing experimentally measured values of electrical conductivity with respect to temperature of the nanomesh structures according to embodiments of the present invention with known values for bulk silicon film.

As shown in FIG. 5, the two highly doped nanomesh devices NM 1 and NM 2 exhibited metallic-like electrical conductivity that followed the bulk trend in both temperature dependence and magnitude. FIG. 5 is a graph showing electrical conductivity, measured with a four-point set-up) versus temperature for two nanomesh films (indicated by the diamonds), both p-type doped with boron to a nominal concentration of $2.0 \times 10^{19}$ cm$^{-3}$. Small spatial variations in the doping levels of the silicon epilayer are standard with spin-cast doping, and this is reflected in the different electrical conductivities of the two nominally equally doped devices. Electrical measurements were performed on separate but substantially identically processed devices as those used for thermal conductivity measurements. Both nanomesh devices exhibit values that are comparable to those for bulk silicon thin film (dashed lines) that are known in the art.

Therefore, as shown in the experimental data shown in FIGS. 3 and 5, the nanomesh devices have significantly lower thermal conductivity κ than bulk materials while retaining bulk-like electrical conductivity σ. As such, the nanomesh structures devices exhibit a significantly improved figure of merit for thermoelectric materials when compared with bulk materials TF, the nanowire array NWA, and the electron beam mask device EBM.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

For example, the above measurements of the thermal and electrical conductivity of the nanomesh structures were measured with the device in a vacuum. However, in other embodiments of the present invention, the nanoscale features (e.g., the voids or holes) may be filled with a second material such as a solid, a liquid, or a gaseous material. In one embodiment of the present invention, the second material has a lower thermal conductivity than the material of the nanomesh such as polymers (polystyrene, parylene, etc.), glasses, ceramics, aerogels (e.g., silica, carbon, alumina, agar, chalcogen), and natural materials (e.g., cellulose). In another embodiment, the second material has a high acoustic mismatch with the material of the nanomesh such as other metamaterials whose thermal (phonon) properties are determined by their internal structure rather than solely by their composition.

The reduction of thermal conductivity κ due to the presence of the nanoscale features would be expected when those features are at scales smaller than the phononic length of the material in which they are formed. For example, as discussed above, the phonon mean free path Λ of silicon is approximately 300 nm. As such, a reduction of thermal conductivity κ would be expected in a silicon film having nanoscale features (e.g., voids) smaller than 300 nm. In the tested nanomesh devices NM 1 and NM 2, the inclusions diameters of 11 nm and 16 nm, respectively, and were spaced at a pitch of 34 nm. However, a reduction of thermal conductivity κ would also be expected if the feature sizes were larger, up to the length of the maximum mean free path of a comparable structure (e.g., of the same thickness as the nanomesh structure) without the nanoscale features. As such, the sizes of the nanoscale features would be designed based on the phonon mean free paths of the structures in which the nanomesh is formed (those phonon mean free paths being determined by the material and its thickness).

What is claimed is:

1. A nanomesh phononic structure comprising:
a mesh comprising a first material, the mesh having a plurality of phononic-sized features spaced apart at a phononic pitch, the phononic pitch being smaller than or equal to twice a maximum phonon mean free path of the first material and the phononic size being smaller than or equal to the maximum phonon mean free path of the first material,
wherein the phononic size is in the range from 5 nm to 100 nm,
wherein the phononic-sized features are discontinuous holes or voids,
wherein the phononic-sized features are filled with a second material different from the first material,
wherein the first material comprises silicon, and
wherein a thermal conductivity of the nanomesh phononic structure is greater than 1 W m$^{-1}$ K$^{-1}$ and less than or equal to 2 W m$^{-1}$ K$^{-1}$.

2. The nanomesh phononic structure of claim 1, wherein the phononic pitch is smaller than twice a dominant phonon mean free path of the first material.

3. The nanomesh phononic structure of claim 1, wherein the second material comprises a material having lower thermal conductivity than the first material or an acoustic mismatch with the first material.

4. The nanomesh phononic structure of claim 1, wherein each of the phononic sized features are approximately 15 nanometers across.

5. The nanomesh phononic structure of claim 1, wherein the phononic pitch is in the range of 10 to 200 nanometers.

6. The nanomesh phononic structure of claim 5, wherein the phononic sized features are spaced at a pitch of approximately 30 nanometers.

7. The nanomesh phononic structure of claim 1, wherein the phononic-sized features are round or rectangular.

8. A thermoelectric device comprising:
a sheet comprising a semiconductor material comprising silicon, the sheet having a plurality of discontinuous phononic-sized features spaced apart at a phononic pitch, the phononic pitch being smaller than or equal to twice a maximum phonon mean free path of the semiconductor material and the phonic size being smaller than or equal to the maximum phonon mean free path of the semiconductor material, the sheet comprising an n-doped region and a p-doped region;
a first electrode electrically coupled to a first side of the sheet; and
a second electrode electrically coupled to a second side of the sheet,
wherein the phononic size is in the range from 5 nm to 100 nm,
wherein the phononic-sized features are filled with a material different from the semiconductor material, and
wherein a thermal conductivity of the sheet is greater than 1 W m$^{-1}$ K$^{-1}$ and less than or equal to 2 W m$^{-1}$ K$^{-1}$.

9. The nanomesh phononic structure of claim 1, wherein the second material comprises a material having an acoustic mismatch with the first material.

* * * * *